US009650714B2

(12) United States Patent
Liu et al.

(10) Patent No.: US 9,650,714 B2
(45) Date of Patent: May 16, 2017

(54) NANOCOMPOSITE REFRACTORY COATINGS AND APPLICATIONS THEREOF

(71) Applicant: Kennametal Inc., Latrobe, PA (US)

(72) Inventors: Zhenyu Liu, Greensburg, PA (US);
Peter Rudolf Leicht, Latrobe, PA (US);
Rodrigo Alejandro Cooper, Latrobe, PA (US); Yixiong Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 172 days.

(21) Appl. No.: 14/563,562

(22) Filed: Dec. 8, 2014

(65) Prior Publication Data

US 2016/0160347 A1 Jun. 9, 2016

(51) Int. Cl.
| | |
|---|---|
| *C23C 16/34* | (2006.01) |
| *C23C 16/44* | (2006.01) |
| *C23C 16/40* | (2006.01) |
| *C23C 16/32* | (2006.01) |
| *C23C 16/36* | (2006.01) |
| *C23C 28/04* | (2006.01) |

(52) U.S. Cl.
CPC .............. *C23C 16/44* (2013.01); *C23C 16/32* (2013.01); *C23C 16/34* (2013.01); *C23C 16/36* (2013.01); *C23C 16/403* (2013.01); *C23C 28/042* (2013.01)

(58) Field of Classification Search
USPC .......... 51/307, 309; 428/216, 325, 336, 697, 428/698, 699, 701, 702
See application file for complete search history.

(56) References Cited

U.S. PATENT DOCUMENTS

| | | | |
|---|---|---|---|
| 4,112,148 | A | 9/1978 | Fonzi |
| 4,180,400 | A | 12/1979 | Smith et al. |
| 4,576,836 | A | 3/1986 | Colmet et al. |
| 4,701,384 | A | 10/1987 | Sarin et al. |

(Continued)

FOREIGN PATENT DOCUMENTS

| | | |
|---|---|---|
| CN | 102581324 A | 7/2012 |
| DE | 2736982 A1 | 3/1979 |

(Continued)

OTHER PUBLICATIONS

X. Feng et al., "Converting Ceria Polyhedral Nanoparticles into Single-Crystal Nanospheres", Science Magazine, vol. 312, Jun. 9, 2006, pp. 1504-1508.

(Continued)

*Primary Examiner* — Archene Turner
(74) *Attorney, Agent, or Firm* — Larry R. Meenan

(57) ABSTRACT

In one aspect, articles are described comprising refractory coatings employing nanocomposite architectures. Articles having such refractory coatings, in some embodiments, are suitable for high wear and/or abrasion applications such as metal cutting operations. A coated article described herein comprises a substrate and a coating deposited by CVD adhered to the substrate, the coating including a refractory layer having a matrix phase comprising alumina and a nanoparticle phase contained within the matrix phase, the nanoparticles phase comprising crystalline nanoparticles formed of at least one of a carbide, nitride or carbonitride of a Group IVB metal.

37 Claims, 5 Drawing Sheets

(a)

(b)

(56) References Cited

U.S. PATENT DOCUMENTS

| | | |
|---|---|---|
| 4,702,970 A | 10/1987 | Sarin et al. |
| 4,745,010 A | 5/1988 | Sarin et al. |
| 4,746,563 A | 5/1988 | Nakano et al. |
| 4,749,629 A | 6/1988 | Sarin et al. |
| 4,751,109 A | 6/1988 | Sarin et al. |
| 4,844,951 A | 7/1989 | Sarin et al. |
| 5,310,607 A | 5/1994 | Schulz et al. |
| 5,447,804 A | 9/1995 | Schulz et al. |
| 5,770,261 A | 6/1998 | Nakamura et al. |
| 5,827,570 A | 10/1998 | Russell |
| 5,871,850 A | 2/1999 | Moriguchi et al. |
| 5,879,823 A | 3/1999 | Prizzi et al. |
| 5,972,495 A | 10/1999 | Ishii et al. |
| 5,985,427 A | 11/1999 | Ueda et al. |
| 6,156,383 A | 12/2000 | Ishii et al. |
| 6,183,846 B1 | 2/2001 | Moriguchi et al. |
| 6,284,356 B1 * | 9/2001 | Kiriyama ............. C23C 30/005 428/701 |
| 6,333,103 B1 | 12/2001 | Ishii et al. |
| 6,426,137 B1 | 7/2002 | Oshika et al. |
| 6,436,519 B2 | 8/2002 | Holzschuh |
| 6,599,062 B1 | 7/2003 | Oles et al. |
| 6,641,939 B1 | 11/2003 | Lee et al. |
| 6,660,371 B1 | 12/2003 | Westphal et al. |
| 6,689,422 B1 | 2/2004 | Warnes et al. |
| 6,713,172 B2 | 3/2004 | Ljungberg et al. |
| 6,726,987 B2 | 4/2004 | Kathrein et al. |
| 6,756,111 B1 | 6/2004 | Okada et al. |
| 6,849,132 B2 | 2/2005 | Warnes et al. |
| 6,869,668 B2 | 3/2005 | Martensson |
| 6,902,764 B2 | 6/2005 | Ljungberg et al. |
| 7,011,867 B2 | 3/2006 | Martensson |
| 7,090,914 B2 | 8/2006 | Yamagata et al. |
| 7,094,447 B2 | 8/2006 | Ruppi |
| 7,163,735 B2 | 1/2007 | Ruppi |
| 7,241,492 B2 | 7/2007 | Kohara et al. |
| 7,273,665 B2 | 9/2007 | Hayahi et al. |
| 7,276,301 B2 | 10/2007 | Tsushima et al. |
| 7,326,461 B2 | 2/2008 | Sottke et al. |
| 7,378,158 B2 | 5/2008 | Richter et al. |
| 7,396,581 B2 | 7/2008 | Ruppi |
| 7,410,707 B2 | 8/2008 | Fukui et al. |
| 7,416,778 B2 | 8/2008 | Westergren et al. |
| 7,442,433 B2 | 10/2008 | Honma et al. |
| 7,498,089 B2 | 3/2009 | Omori et al. |
| 7,531,212 B2 | 5/2009 | Kohara et al. |
| 7,531,213 B2 | 5/2009 | Bjormander |
| 7,597,511 B2 | 10/2009 | Tomita et al. |
| 7,597,951 B2 | 10/2009 | Bjormander et al. |
| 7,597,970 B2 | 10/2009 | Fukano et al. |
| 7,691,496 B2 | 4/2010 | Park et al. |
| 7,803,464 B2 | 9/2010 | Okada et al. |
| 7,820,310 B2 | 10/2010 | Bjormander |
| 7,901,788 B2 | 3/2011 | Warnes et al. |
| 7,906,230 B2 | 3/2011 | Watanabe et al. |
| 7,923,101 B2 | 4/2011 | Ruppi |
| 7,928,028 B2 | 4/2011 | Nawa et al. |
| 7,939,181 B2 | 5/2011 | Ramm et al. |
| 7,967,533 B2 | 6/2011 | Omori et al. |
| 7,968,182 B2 | 6/2011 | Trinh et al. |
| 7,972,714 B2 | 7/2011 | Okada et al. |
| 8,012,611 B2 | 9/2011 | Okada et al. |
| 8,025,991 B2 | 9/2011 | Schier |
| 8,071,211 B2 | 12/2011 | Koike et al. |
| 8,080,312 B2 | 12/2011 | McNerny et al. |
| 8,097,332 B2 | 1/2012 | Omori et al. |
| 8,119,226 B2 | 2/2012 | Reineck et al. |
| 8,119,227 B2 | 2/2012 | Reineck et al. |
| 8,129,040 B2 | 3/2012 | Quinto et al. |
| 8,152,971 B2 | 4/2012 | Quinto et al. |
| 8,221,838 B2 | 7/2012 | Gates, Jr. et al. |
| 8,288,019 B2 | 10/2012 | Nagano et al. |
| 2001/0006724 A1 | 7/2001 | Holzschuh |
| 2002/0114945 A1 | 8/2002 | Greenberg et al. |
| 2006/0029813 A1 | 2/2006 | Kutilek et al. |
| 2007/0289280 A1 | 12/2007 | Marquardt |
| 2012/0003452 A1 | 1/2012 | Tomita et al. |

FOREIGN PATENT DOCUMENTS

| | | | |
|---|---|---|---|
| JP | 56152962 A | | 11/1981 |
| JP | 57158372 A | | 9/1982 |
| JP | 5921586 A | | 2/1984 |
| JP | 5985860 A | | 5/1984 |
| JP | 04-256503 | * | 9/1992 |
| JP | 0516031 A | | 1/1993 |
| JP | 4195518 B2 | | 7/1998 |
| JP | 2000-218409 | * | 8/2000 |
| JP | 4019244 B2 | | 6/2002 |
| JP | 2003039207 A | | 2/2003 |
| JP | 2005-279825 | * | 10/2005 |
| JP | 2006219739 A | | 8/2006 |
| JP | 4645983 B2 | | 10/2006 |
| JP | 2006289556 A | | 10/2006 |
| JP | 2008019489 A | | 1/2008 |
| JP | 2008019498 A | | 1/2008 |
| JP | 4822120 B2 | | 2/2008 |
| JP | 5019255 B2 | | 1/2009 |
| JP | 5099490 B2 | | 4/2009 |
| JP | 5099500 B2 | | 7/2009 |
| JP | 2011057529 A | | 3/2011 |
| JP | 2011127165 A | | 6/2011 |
| JP | 2011184295 A | | 9/2011 |
| JP | 2012143825 A | | 8/2012 |

OTHER PUBLICATIONS

Z. Yu et al., "Atomic-resolution observation of Hf-doped alumina grain boundaries", SciVerse ScienceDirect, Scripta Materialia 68 (2013) pp. 703-706.

N. Shibata et al., "Atomic-scale imaging of individual dopant atoms in a buried interface", Nature Materials, vol. 8, 2009, pp. 654-658.

J. P. Buban et al., "Grain Boundary Strengthening in Alumina by Rare Earth Impurities", Science Magazine, vol. 311, Jan. 13, 2006, pp. 212-215.

Z. Li et al., "Nanodomain formation and distribution in Gd-doped ceria", SciVerse ScienceDirect, Materials Research Bulletin 47 (2012) pp. 763-767.

C. Bjormander, "CVD deposition and characterization of coloured Al2O3/ZrO2 multilayers", ScienceDirect, Surface & Coatings Technology 201 (2006) pp. 4032-4036.

D. Hochauer et al., "Titanium doped CVD alumina coatings", ScienceDirect, Surface & Coatings Technology 203 (2008) pp. 350-356.

W. C. Russell et al., "Wear Characteristics and Performance of Composite Alumina-Zirconia CVD Coatings", Int. J. of Refractory Metals & Hard Materials 14 (1996) pp. 51-58.

S. Taylor, "Grain Boundary Structure and Solute Segregation in Titanium-Doped Sapphire Bicrystals", Disseeration, University of California, Berkley, Spring 2002, pp. 1-222.

* cited by examiner

NANOCOMPOSITE REFRACTORY COATINGS AND APPLICATIONS THEREOF

FIELD

The present invention relates to refractory coatings and, in particular, to refractory coatings deposited by chemical vapor deposition (CVD) for cutting tool applications.

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools.

SUMMARY

In one aspect, articles are described comprising refractory coatings employing nanocomposite architectures. Briefly, a coated article described herein comprises a substrate and a coating deposited by CVD adhered to the substrate, the coating including a refractory layer having a matrix phase comprising alumina and a nanoparticle phase contained within the matrix phase, the nanoparticle phase comprising crystalline nanoparticles of at least one of a carbide, nitride and carbonitride of a Group IVB metal. The nanoparticles, in some embodiments, are imbedded within alumina grains of the matrix phase. Further, the nanoparticles can be dispersed throughout the matrix phase in a predetermined manner. In some embodiments, for example, the nanoparticles are distributed in the alumina matrix phase in one or more nanoparticle concentration bands. The nanoparticle concentration bands can exhibit periodic separation or aperiodic separation along the thickness of the refractory layer. In some embodiments, nanoparticle distribution in the alumina matrix phase is predetermined and controlled with CVD deposition parameters discussed herein.

These and other embodiments are described further in the detailed description which follows.

DETAILED DESCRIPTION

Figure 1:
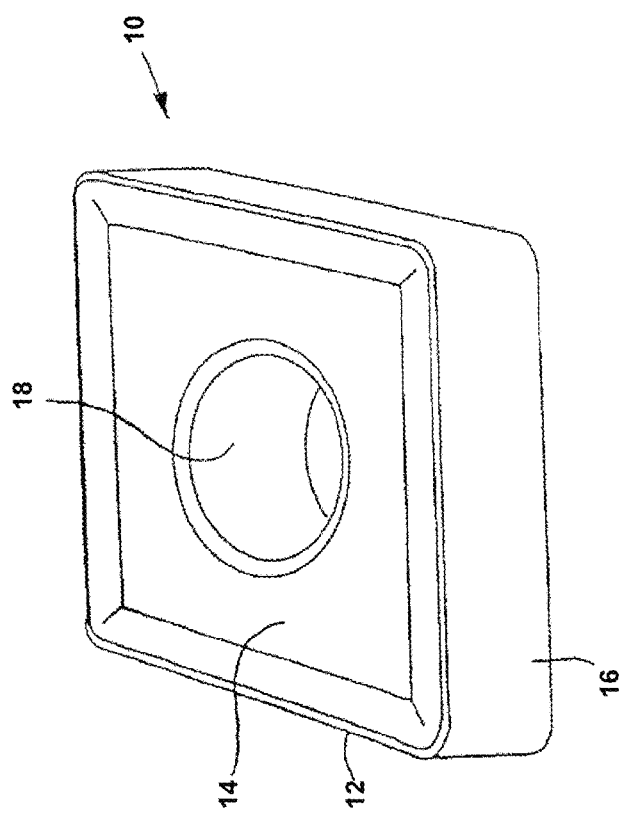
FIG. 1 illustrates a cutting tool substrate according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, articles are described comprising refractory coatings employing nanocomposite architectures. Articles having such refractory coatings, in some embodiments, are suitable for high wear and/or abrasion applications such as metal cutting operations. A coated article described herein comprises a substrate and a coating deposited by CVD adhered to the substrate, the coating including a refractory layer having a matrix phase comprising alumina and a nanoparticle phase contained within the matrix phase, the nanoparticle phase comprising crystalline nanoparticles of at least one of a carbide, nitride and carbonitride of a Group IVB metal. The nanoparticles, in some embodiments, are imbedded within alumina grains of the matrix phase. In being imbedded in the alumina grains, the nanoparticles do not terminate alumina grain development or growth during deposition of the refractory layer. Therefore, a singular alumina grain can exhibit several regions of nanoparticle reinforcement. Further, the nanoparticles can be dispersed throughout the alumina matrix phase in a predetermined manner.

Turning now to specific components, coated articles described herein comprise a substrate. A coated article can comprise any substrate not inconsistent with the objectives of the present invention. For example, a substrate can be a cutting tool or tooling used in wear applications. Cutting tools include, but are not limited to, indexable cutting inserts, end mills or drills. Indexable cutting inserts can have any desired ANSI standard geometry for milling or turning applications. Substrates of coated articles described herein can be formed of cemented carbide, carbide, ceramic, cermet, steel or other alloy. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 1 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

A cutting tool substrate can comprise one or more cutting edges formed at the juncture of a rake face and flank face(s) of the substrate. FIG. 1 illustrates a cutting insert substrate according to one embodiment described herein. As illustrated in FIG. 1, the substrate (10) has cutting edges (12) formed at junctions of the substrate rake face (14) and flank faces (16). The substrate (10) also comprises an aperture (18) for securing the substrate (10) to a tool holder.

As described herein, a coating adhered to the substrate includes a refractory layer having a matrix phase comprising alumina and a nanoparticle phase contained within the matrix phase, the nanoparticle phase comprising crystalline nanoparticles formed of at least one of a carbide, nitride and carbonitride of a Group IVB metal. Groups of the Periodic Table described herein are identified according to the CAS designation, where Group IVB includes titanium, zirconium and hafnium. Generally, the crystalline nanoparticles have an average size less than 100 nm in at least one dimension. In some embodiments, the crystalline nanoparticles have an average size less than 10 nm or less than 5 nm in one dimension. Further, the crystalline nanoparticles can exhibit an average size less than 20 nm in two or more dimensions. For example, the crystalline nanoparticles can have an average diameter selected from Table I and an average length selected from Table II.

TABLE I

| Crystalline Nanoparticle Average Diameter (nm) |
| --- |
| ≤100 |
| ≤5 |
| 1-5 |
| 1-3 |

TABLE II

| Crystalline Nanoparticle Average Length (nm) |
| --- |
| ≤500 |
| ≤100 |
| 5-500 |
| 10-100 |
| 20-250 |
| 5-20 |

Crystalline nanoparticles of a Group IVB metal nitride, carbide or carbonitride can exhibit a generally spherical shape, elliptical shape or rod-like shape. In some embodiments, the crystalline nanoparticles can have a rice-like shape or irregular shape. Moreover, crystalline nanoparticle shape can be substantially uniform throughout the refractory layer. Alternatively, crystalline nanoparticle shape can vary in the refractory layer.

Crystalline nanoparticles of at least one of a Group IVB metal nitride, carbide and carbonitride can have any desired distribution in the alumina matrix phase, including substantially uniform as well as heterogeneous distributions. The nanoparticles, for example, can be dispersed throughout the matrix phase in a predetermined manner. In some embodiments, for example, the nanoparticles are distributed in the alumina matrix phase in one or more nanoparticle concentration bands. Nanoparticle concentration bands can exhibit periodic separation or aperiodic separation along the thickness of the refractory layer. Separation distance(s) of nanoparticle concentration bands can be selected according to several considerations including, but not limited to, refractory layer thickness, concentration of the crystalline nanoparticle reinforcement and compositional identity of the crystalline nanoparticles. Nanoparticle concentration band separation can range from tens of nanometers to microns. In some embodiments, separation distance(s) of nanoparticle concentration bands are selected from Table

TABLE III

| Nanoparticle Concentration Band Separation Distance |
| --- |
| ≤5 μm |
| 0.050 μm-1 μm |
| 0.010 μm-0.5 μm |
| 0.030 μm-0.3 μm |
| 0.1 μm-2 μm |
| 0.1 μm-1 μm |

Further, individual nanoparticle concentration bands can have a thickness less than 50 nm.

Compositional identity of the crystalline nanoparticles can be substantially uniform throughout the refractory layer. Alternatively, compositional identity of the crystalline nanoparticles can be varied throughout the refractory layer. For example, nanoparticle concentration bands can be formed independent of one another permitting the Group IVB metal of the crystalline nanoparticles to be varied along the thickness of the refractory layer. When varied, the Group IVB metals can present any desired pattern in the nanocrystalline phase such as alternating or periodic distribution along the thickness of the refractory layer. Alternatively, the Group IVB metals can exhibit a random distribution. Additionally, the non-metallic component of the crystalline nanoparticles can vary along the thickness of the refractory layer. Group IVB metal nitrides, carbides or carbonitrides and/or their combinations can present any desired pattern in the nanocrystalline phase(s), including alternating or periodic distribution along the thickness of the refractory layer. The non-metallic component can also exhibit a random distribution. The ability independently vary metallic (Ti, Zr, Hf) components and non-metallic (C, N, CN) components of the crystalline nanoparticles across the thickness of the refractory layer permits freedom of design to meet a variety of wear applications and environments.

As described herein, the crystalline nanoparticle phase(s) is contained within an alumina matrix phase. Depending on CVD conditions, the alumina matrix phase can be α-alumina, κ-alumina or mixtures (α/κ) thereof. Importantly, the crystalline nanoparticles do not terminate alumina grain development during deposition of the refractory layer. For example, deposition of the crystalline nanoparticles on alumina grains of the refractory layer does not terminate growth of the alumina grains or require alumina renucleation to continue grain development. The continued growth of alumina grains following crystalline nanoparticle deposition can embed the nanoparticles within the alumina grains. Therefore, a singular alumina grain can serve as a substrate for several regions/cycles of crystalline nanoparticle reinforcement. Further, alumina grains of the refractory layer can have a generally columnar morphology on the micron or submicron scale. In some embodiments, for example, the alumina grains have a length in the growth direction ranging from 500 nm to greater than 1 am. The alumina grains, in some embodiments, have a length in the growth direction selected from Table IV.

TABLE IV

Columnar Alumina Grain Length 500 nm-5 μm
1 μm-10 μm
1 μm-5 μm
2 μm-10 μm

Figure 2:
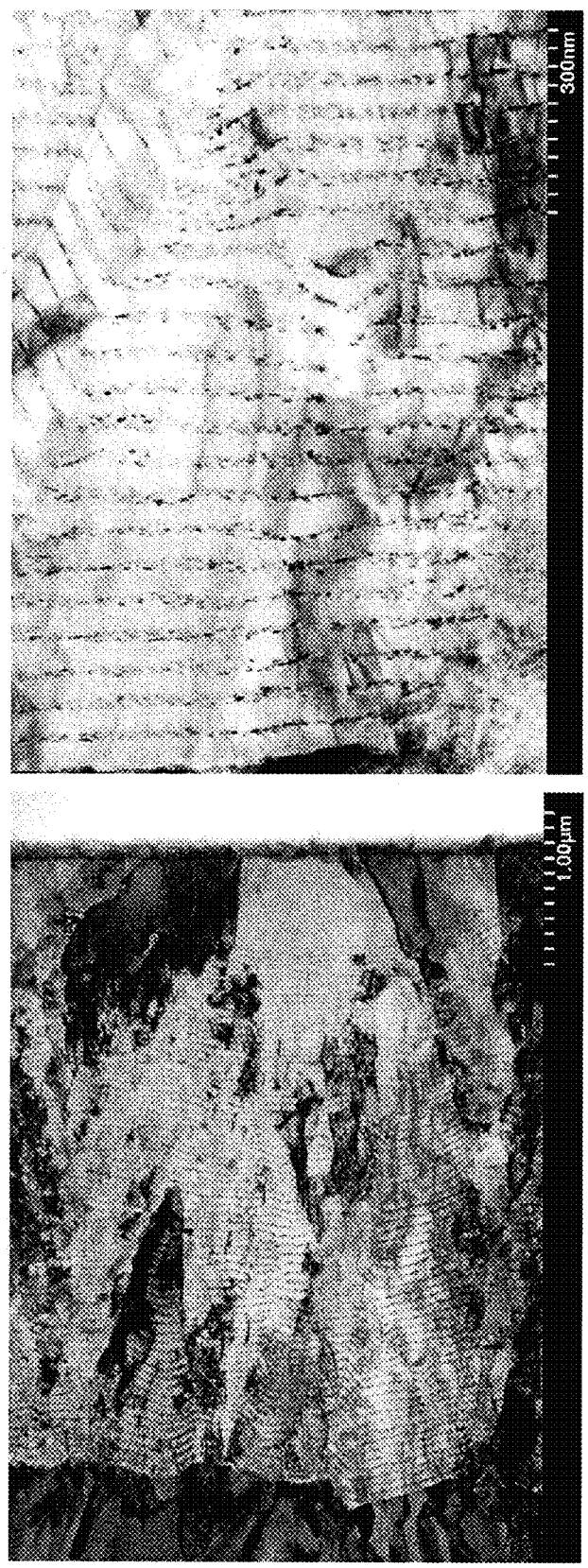
FIGS. 2(a)-(b) are cross-sectional transmission electron microscopy (TEM) images of a section of a nanocomposite refractory layer according to one embodiment described herein.
Figure 3:
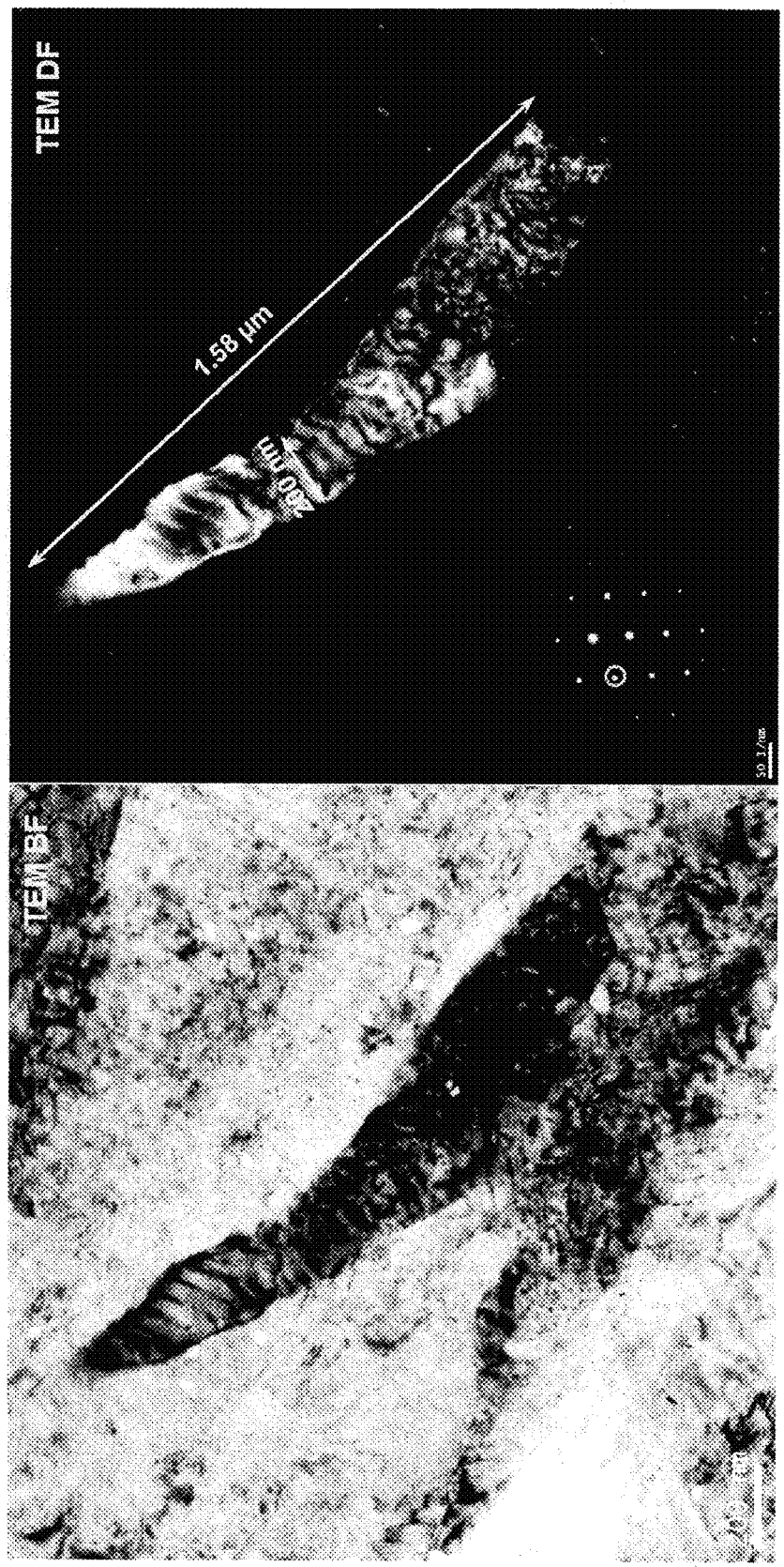
FIGS. 3(a)-(b) are TEM images of sections of a nanocomposite refractory layer according to one embodiment described herein.

FIGS. 2(a)-(b) are cross-sectional TEM images of a section of a nanocomposite refractory layer comprising an alumina matrix phase and a titanium nitride (TiN) crystalline nanoparticle phase according to one embodiment described herein. As illustrated in FIG. 2, TiN crystalline nanoparticles of rod-shaped morphology are imbedded in the alumina grains as nanoparticle concentration bands. The nanoparticle concentration bands are displayed as perforated lines in the alumina grains having periodic separation of about 50 nm. FIG. 3 provides (a) TEM bright field (BF) and corresponding (b) dark field (DF) images of the TiN—$Al_2O_3$ nanocomposite refractory layer detailing alumina grain morphology according to one embodiment. The highlighted alumina grain exhibits a columnar structure on the micron scale. As in FIG. 2, TiN crystalline nanoparticles of rod-shaped morphology are imbedded in the alumina grain as nanoparticle concentration bands.

Figure 4:
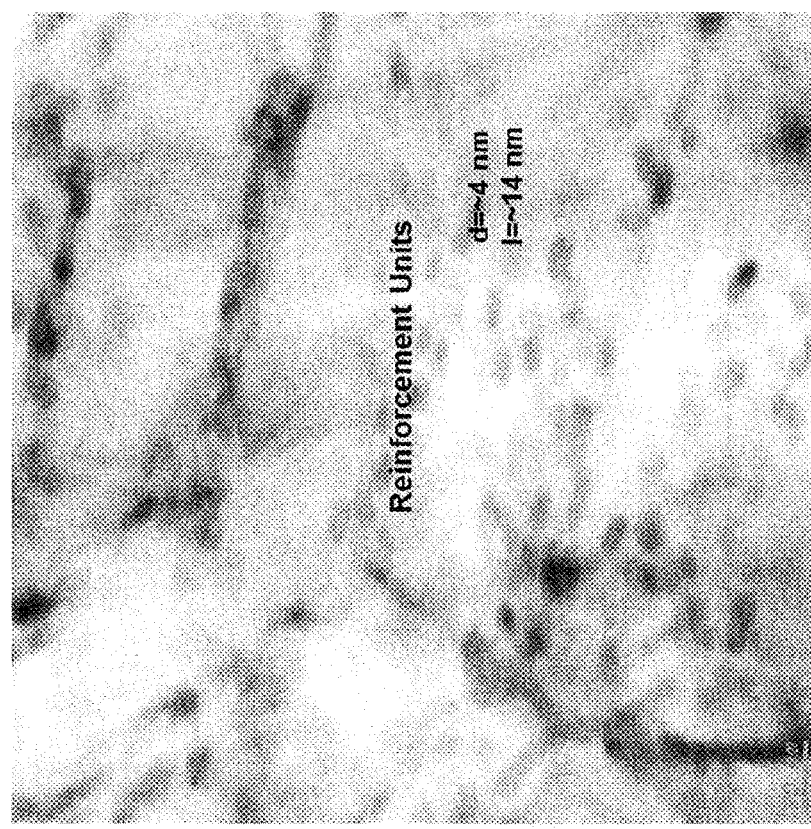
FIGS. 4(a)-(b) are TEM images of sections of a nanocomposite refractory layer according to one embodiment described herein.
Figure 4:
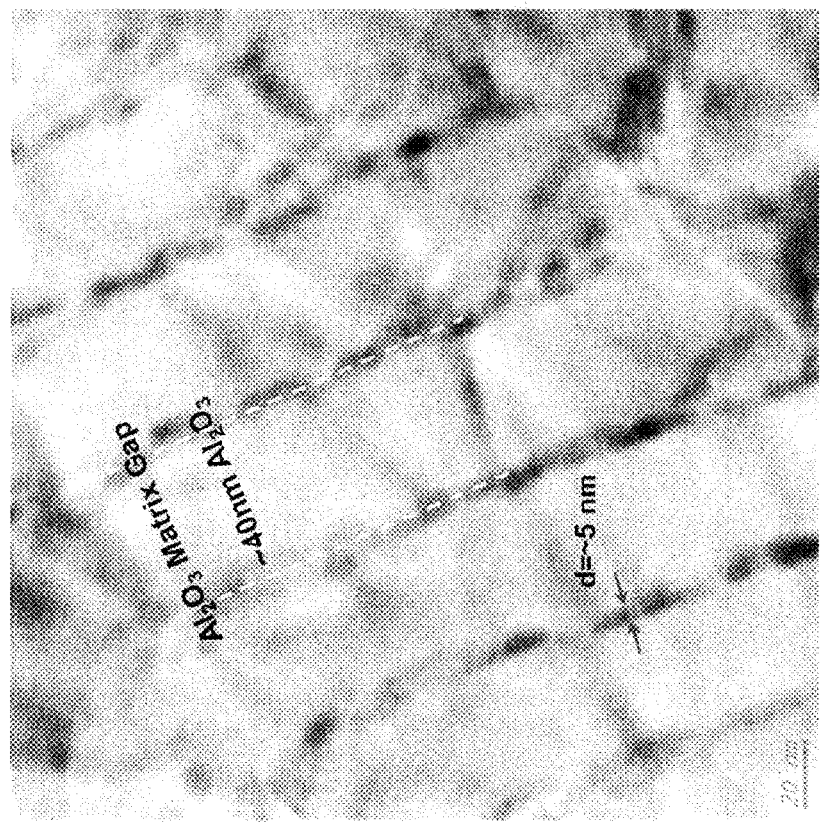

FIGS. 4(a)-(b) are also cross-sectional TEM images of a section of a TiN—$Al_2O_3$ nanocomposite refractory layer according to another embodiment described herein. Similar to FIG. 2, the TiN crystalline nanoparticles are imbedded in the alumina grain as nanoparticle concentration bands. As illustrated in FIG. 4(b), the TiN nanoparticles are rod-shaped, generally having diameter of 5 nm and length of 10-20 nm. Further, the TiN nanoparticle concentration bands have periodic separation of about 40 nm.

Figure 5:
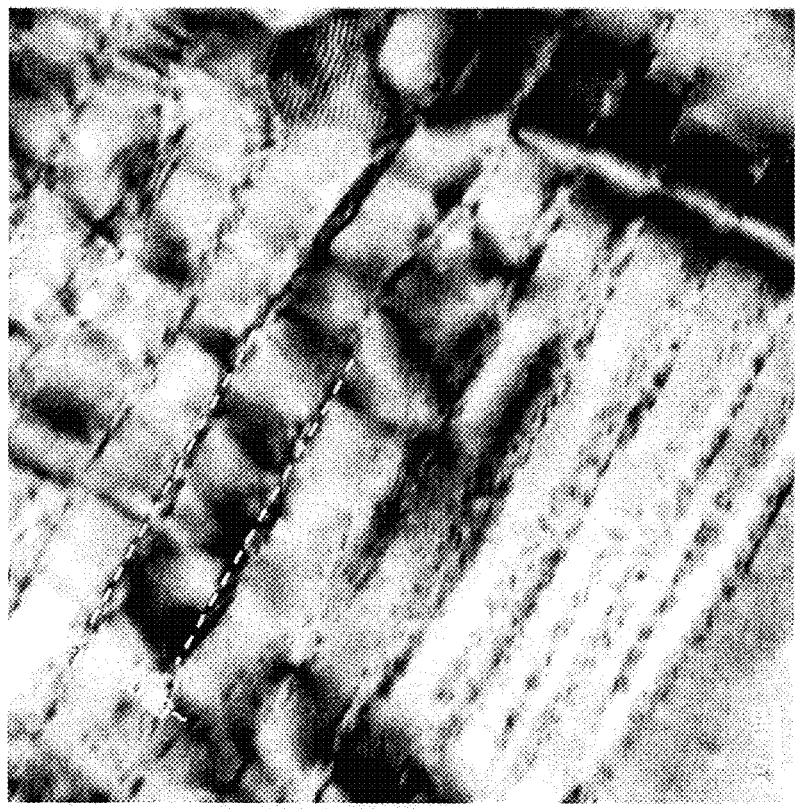
FIGS. 5(a)-(b) are TEM images of sections of a nanocomposite refractory layer according to one embodiment described herein.
Figure 5:
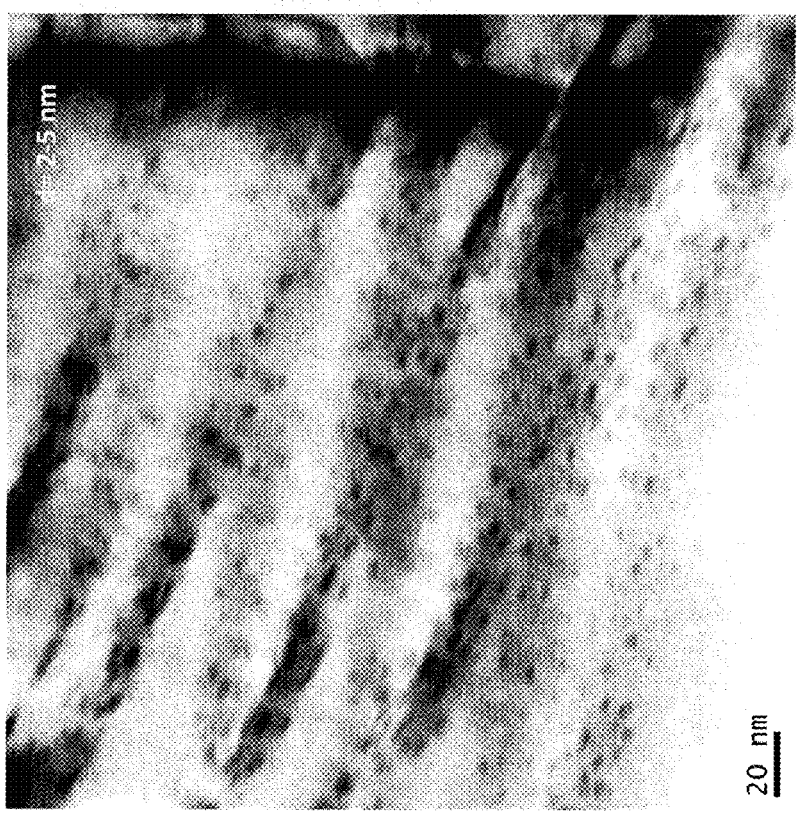

FIGS. 5(a)-(b) are cross-sectional TEM images of a section of a TiC—$Al_2O_3$ nanocomposite refractory layer according to one embodiment described herein. The crystalline TiC nanoparticles are 2-5 nm in diameter and are distributed in concentration bands within the alumina grains. The TiC nanoparticle concentration bands exhibit periodic separation of about 50 nm.

In some embodiments, crystalline nanoparticles of one or more concentration bands can aggregate forming a continuous layer in the alumina matrix phase. In such embodiments, the continuous layer of aggregated crystalline nanoparticles can generally have a thickness of 5 nm to 50 nm. Further, in some embodiments, Group IVB metal can be present in the alumina matrix phase adjacent to regions of the crystalline nanoparticles, forming doped alumina phases such as $TiAl_2O_3$ and/or $ZrAl_2O_3$. As set forth in the CVD parameters described herein, transition between nanoparticle deposition and alumina matrix deposition can permit introduction of Group IVB metal into the alumina matrix. Additionally, the alumina matrix phase may also include a Group IVB metal oxide.

The refractory layer comprising the alumina matrix phase and nanoparticle phase embedded therein can be deposited directly on the substrate surface. Alternatively, a coating described herein can further comprise one or more inner layers between the nanocomposite refractory layer and the substrate. Inner layer(s), in some embodiments, comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. In some embodiments, one or more inner layers between the substrate and refractory layer comprise a carbide, nitride, carbonitride, oxycarbonitride, oxide or boride of one or more metallic elements selected from the group consisting of aluminum and metallic elements of Groups IVB, VB and VIB of the Periodic Table.

For example, one or more inner layers are selected from the group consisting of titanium nitride, titanium carbonitride, titanium oxycarbonitride, titanium carbide, zirconium nitride, zirconium carbonitride, hafnium nitride and hafnium carbonitride. Further, a layer of titanium oxycarbonitride can be employed as a bonding layer for the refractory layer and inner layers of the coating. Inner layer(s) of the coating can have any thickness not inconsistent with the objectives of the present invention. In some embodiments, a single inner layer can have a thickness of at least 1.5 μm. Alternatively, a plurality of inner layers can collectively achieve thickness of at least 1.5 μm.

The refractory layer comprising the alumina matrix phase and nanoparticle phase embedded therein can be the outermost layer of the coating. Alternatively, a coating described herein can comprise one or more outer layers over the refractory layer. Outer layer(s) can comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. Outer layer(s) over the refractory layer can comprise a carbide, nitride, carbonitride, oxycarbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium oxycarbonitride, titanium carbide, zirconium nitride, zirconium carbonitride, hafnium nitride, hafnium carbonitride and alumina and mixtures thereof.

Outer layers of coatings described herein can have any thickness not inconsistent with the objectives of the present invention. A coating outer layer, in some embodiments, can have a thickness ranging from 0.2 μm to 5 μm.

Coatings described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting and steam blasting. Wet blasting, for example, is accomplished using a slurry of inorganic and/or ceramic particles, such as alumina, and water. The alumina particle slurry can be pneumatically projected at a surface of the coated cutting tool body to impinge on the surface of the coating. The alumina particles can generally range in size between about 20 μm and about 100 μm.

Blasting parameters include pressure, angle of impingement, distance to the part surface and duration. In some embodiments, angle of impingement can range from about 10 degrees to about 90 degrees, i.e., the particles impinge the coating surface at an angle ranging from about 10 degrees to about 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 μm to 10 μm. In one embodiment, a 5-10 μm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the cutting tool.

A coating described herein can be blasted or polished for a time period sufficient to achieve a desired surface roughness ($R_a$) and/or other parameters such as reducing residual tensile stress in the coating. In some embodiments, a coating subjected to post-coat treatment has a surface roughness ($R_a$) selected from Table V.

TABLE V

| Post-Coat Surface Roughness ($R_a$) Coating Surface Roughness ($R_a$)-nm |
| --- |
| ≤500 |
| ≤250 |
| ≤200 |
| 10-250 |
| 50-175 |
| 25-150 |

Coating surface roughness can be determined by optical profilometry using WYKO® NT-Series Optical Profilers commercially available from Veeco Instruments, Inc. of Plainview, N.Y.

Further, a post-coat treatment, in some embodiments, does not remove one or more outer layers of the coating. In some embodiments, for example, a post-coat treatment does not remove an outer layer of TiN, TiCN and/or TiOCN. Alternatively, a post-coat treatment can remove or partially remove one or more outer layers, such as TiN, TiCN and TiOCN.

A coating described herein comprising a refractory layer having an alumina matrix phase and a nanoparticle phase therein can have nanohardness of at least 25 GPa or at least 30 GPa. In some embodiments, the coating has nanohardness of 25 GPa to 35 GPa. Coating nanohardness can be in the as-deposited state. Alternatively, the nanohardness can reflect a blasted or polished condition of the coating. Coating nanohardness values recited herein were determined from nano-indentation testing conducted with a Fischerscope HM2000 in accordance with ISO standard 14577 using a Vickers indenter. Indentation depth was set to 0.2 μm.

As described herein, the nanocomposite refractory layer is deposited by CVD. The alumina matrix can be deposited from a gaseous mixture of $AlCl_3$, $H_2$, $CO_2$, HCl and optionally $H_2S$. General CVD processing parameters for depositing the alumina matrix are provided in Table VI.

The crystalline nanoparticles formed of at least one of a carbide, nitride and carbonitride of a Group IVB metal are deposited on alumina grains of the matrix phase by the pulsed introduction into the reactor of a gaseous mixture including reactants suitable for forming the crystalline nanoparticles. Importantly, each deposition of crystalline nanoparticles on the alumina matrix phase can be independent of any prior nanoparticle deposition. Therefore, gaseous reactants for nanoparticle deposition can vary over the duration of refractory layer synthesis. Group IVB metal nitride nanocrystals can be deposited from a gaseous mixture comprising $H_2$, $N_2$, HCl and gaseous reactant containing the Group IVB metal. In some embodiments, the gaseous reactant is metal chloride, such as $MCl_4$, wherein M is a Group IVB metal. General CVD processing parameters for Group IVB metal nitride nanocrystals are provided in Table VII.

TABLE VII

| Group IVB Metal Nitride Nanocrystal CVD Processing Parameters | | | | | | |
| --- | --- | --- | --- | --- | --- | --- |
| Process Step | $H_2$ vol. % | $N_2$ vol. % | $MCl_4$ vol. % | HCl | Temperature ° C. | Pressure mbar | Time min. |
| MN* Nanocrystals | Bal. | 12-20 | 0.2-2 | 0-5 | 900-1050 | 50-200 | 3-60 |

*M = Group IVB metal

Group IVB metal carbide nanocrystals can be deposited from a gaseous mixture comprising $H_2$, $CH_4$, HCl and gaseous reactant containing the Group IVB metal. In some embodiments, the gaseous reactant is metal chloride, such as $MCl_4$, wherein M is a Group IVB metal. General CVD processing parameters for Group IVB metal carbide nanocrystals are provided in Table VIII.

TABLE VIII

| Group IVB Metal Carbide Nanocrystal CVD Processing Parameters | | | | | | |
| --- | --- | --- | --- | --- | --- | --- |
| Process Step | $H_2$ vol. % | $CH_4$ vol. % | $MCl_4$ vol. % | HCl vol. % | Temperature ° C. | Pressure mbar | Time min. |
| MC* Nanocrystals | Bal. | 1-5 | 0.1-2 | 0-5 | 900-1050 | 50-200 | 3-60 |

Group IVB metal carbonitride nanocrystals can be deposited from a gaseous mixture comprising $H_2$, $CH_4$, HCl, $N_2$ and gaseous reactant containing the Group IVB metal. In some embodiments, the gaseous reactant is metal chloride, such as $MCl_4$, wherein M is a Group IVB metal. General CVD processing parameters for Group IVB metal carbonitride nanocrystals are provided in Table IX.

TABLE VI

| Alumina Matrix CVD Processing Parameters | | | | | | | | |
| --- | --- | --- | --- | --- | --- | --- | --- | --- |
| Process Step | $H_2$ vol. % | $AlCl_3$ vol. % | $CO_2$ vol. % | CO vol. % | $H_2S$ vol. % | HCl vol. % | Temperature ° C. | Pressure mbar | Time min. |
| $Al_2O_3$ | Bal. | 1-5 | 0.5-6 | — | 0.05-0.6 | 0.05-5 | 950-1050 | 50-120 | 3-500 |

TABLE IX

Group IVB Metal Carbonitride Nanocrystal CVD Processing Parameters

| Process Step | $H_2$ vol. % | $N_2$ vol. % | $CH_4$ vol. % | $MCl_4$ vol. % | HCl | Temperature °C. | Pressure mbar | Time min. |
|---|---|---|---|---|---|---|---|---|
| MCN* Nano-crystals | Bal. | 10-15 | 1-5 | 1-5 | 0-5 | 900-1050 | 50-200 | 3-60 |

As described herein, nanoparticle deposition by pulsed introduction of suitable reactant gasses does not terminate alumina grain development or require alumina renucleation to continue alumina grain development/growth during deposition of the refractory layer. Therefore, alumina grain growth is resumed after pulsed nanoparticle deposition by reintroduction of the reactant gas mixture of Table VI. Continued alumina grain growth embeds the nanoparticle phase in the grain architecture as illustrated in FIGS. 2-5 herein.

The refractory layer can be deposited directly on the substrate surface. Alternatively, a plurality of coating inner layers can reside between the substrate and refractory layer. General CVD deposition parameters for various inner layers are provided in Table X.

TABLE X

CVD Parameters for Inner layer Deposition

| Base Layer Composition | Gas Mixture | Temperature °C. | Pressure mbar | Duration min. |
|---|---|---|---|---|
| TiN | $H_2$, $N_2$, $TiCl_4$ | 800-900 | 60-100 | 10-90 |
| MT-TiCN | $H_2$, $N_2$, $TiCl_4$, $CH_3CN$ | 750-900 | 65-100 | 50-400 |
| HT-TiCN | $H_2$, $N_2$, $TiCl_4$, $CH_4$ | 900-1050 | 60-160 | 30-200 |
| TiOCN | $H_2$, $N_2$, $TiCl_4$, $CH_4$, CO | 900-1050 | 200-550 | 30-70 |

The foregoing general CVD parameters for inner layer deposition, in some embodiments, can be applied for deposition of one or more outer layers over the refractory layer.

These and other embodiments are further illustrated in the following non-limiting examples.

Example 1

Coated Cutting Tools

Coated cutting tools described herein were produced by placing cemented tungsten carbide (WC—Co) cutting insert substrates [ANSI standard geometry CNMG432RN] into an axial flow hot-wall CVD reactor. The cutting inserts comprised 6 wt. % cobalt binder with the balance WC grains of size 1-5 μm. A coating including a refractory layer comprising a matrix phase of alumina and crystalline TiN nanoparticle phase was deposited on the cutting inserts according to Tables XI and XII. The crystalline TiN nanoparticles were distributed in ninety-six (96) nanoparticle concentration bands along the thickness of the refractory layer, the 96 nanoparticle concentration bands corresponding to 96 cycles of TiN deposition according to Table XI. The nanocomposite refractory layer morphology was consistent with the cross-sectional TEM images provided in FIGS. 2 and 3 discussed above. An outer layer of TiN was deposited over the nanocomposite refractory layer to complete the coating. Alternatively, if desired, an outer layer of TiOCN can be deposited over the nanocomposite refractory layer to complete the coating.

TABLE XI

CVD Deposition of Coating

| Process Step | $H_2$ vol. % | $N_2$ vol. % | $TiCl_4$ vol. % | $CH_3CN$ vol. % | $CH_4$ vol. % | $AlCl_3$ vol. % | $CO_2$ vol. % | CO vol. % | HCl vol. % | $H_2S$ vol. % |
|---|---|---|---|---|---|---|---|---|---|---|
| TiN | Bal. | 18.40 | 0.95 | — | — | — | — | — | — | — |
| MT-TiCN | Bal. | 27.8 | 1.31 | 0.001 | — | — | — | — | 1.40 | — |
| HT-TiCN | Bal. | 16.69 | 0.76 | — | 3.70 | — | — | — | — | — |
| TiOCN | Bal. | 17.50 | 1.08 | — | 2.52 | — | — | 1.10 | 1.10 | — |
| $Al_2O_3$ | Bal. | — | — | — | — | 4.84 | 2.42 | — | 3.00 | 0.10 |
| TiN Nano-reinforcement* | Bal. | 18.00 | 0.95 | — | — | — | — | — | Opt. | — |
| TiN (Outer Layer) | Bal. | 25.70 | 0.76 | — | — | — | — | — | 0.69 | — |
| TiOCN** (Outer Layer) | Bal. | 38.00 | 0.99 | — | 2.6 | — | — | 1.12 | 1.00 | — |

*Periodic introduction onto alumina layer to form TiN nanophase reinforcement
**Alternative to TiN outer layer

TABLE XII

CVD Deposition Steps

| Process Step | Temperature °C. | Pressure mbar | Time min. |
|---|---|---|---|
| TiN | 850-960 | 60-90 | 10-90 |
| MT-TiCN | 900-940 | 70-100 | 50-400 |
| HT-TiCN | 900-1050 | 60-150 | 30-200 |
| TiOCN | 950-1050 | 200-500 | 30-70 |

TABLE XII-continued

CVD Deposition Steps

| Process Step | Temperature °C. | Pressure mbar | Time min. |
|---|---|---|---|
| Al₂O₃ | 950-1050 | 50-120 | 10-500 |
| TiN Nano-reinforcement* | 900-1050 | 50-200 | 3-60 (per reinforcement deposition) |
| TiN (Outer Layer) | 900-1050 | 50-200 | 30-180 |
| TiOCN (Outer Layer)** | 950-1050 | 200-500 | 30-200 |

*Periodic introduction onto alumina layer to form TiN nanophase reinforcement.
**Alternative to TiN outer layer The resulting coating exhibited the properties provided in Table XIII.

TABLE XIII

Properties of CVD Coating

| Coating Layers | Thickness (μm) |
|---|---|
| TiN | 0.5 |
| MT-TiCN | 10.5 |
| HT-TiCN | 0.8 |
| Al₂O₃-[TiN]₉₆ | 9.0 |
| TiN | 1.6 |

Example 2

Coated Cutting Tools

WC—Co cutting insert substrates consistent with the substrates described in Example 1 were placed into an axial flow hot-wall CVD reactor. A coating including a refractory layer comprising a matrix phase of alumina and crystalline TiC nanoparticle phase was deposited on the cutting inserts according to Tables XIV and XV. The crystalline TiC nanoparticles were distributed in ninety-six (96) nanoparticle concentration bands along the thickness of the refractory layer, the 96 nanoparticle concentration bands corresponding to 96 cycles of TiC deposition according to Table XIV. The nanocomposite refractory layer morphology was consistent with the cross-sectional TEM images provided in FIG. 4 discussed above. An outer layer of TiN was deposited over the nanocomposite refractory layer to complete the coating. Alternatively, if desired, an outer layer of TiOCN can be deposited over the nanocomposite refractory layer to complete the coating.

TABLE XIV

CVD Deposition of Coating

| Process Step | H₂ vol. % | N₂ vol. % | TiCl₄ vol. % | CH₃CN vol. % | CH₄ vol. % | AlCl₃ vol. % | CO₂ vol. % | CO vol. % | HCl vol. % | H₂S vol. % |
|---|---|---|---|---|---|---|---|---|---|---|
| TiN | Bal. | 18.40 | 0.95 | — | — | — | — | — | — | — |
| MT-TiCN | Bal. | 27.8 | 1.31 | 0.001 | — | — | — | — | 1.40 | — |
| HT-TiCN | Bal. | 16.69 | 0.76 | — | 3.70 | — | — | — | — | — |
| TiOCN | Bal. | 17.50 | 1.08 | — | 2.52 | — | — | 1.10 | 1.10 | — |
| Al₂O₃ | Bal. | — | — | — | — | 4.84 | 2.42 | — | 3.00 | 0.10 |
| TiC Nano-reinforcement* | Bal. | — | 0.50 | — | 2.30 | — | — | — | 2.50 | — |
| TiN (Outer Layer) | Bal. | 25.70 | 0.76 | — | — | — | — | — | 0.69 | — |
| TiOCN** (Outer Layer) | Bal. | 38.00 | 0.99 | — | 2.6 | — | — | 1.12 | 1.00 | — |

*Periodic introduction onto alumina layer to form TiN nanophase reinforcement.
**Alternative to TiN outer layer

TABLE XV

CVD Deposition Steps

| Process Step | Temperature °C. | Pressure mbar | Time min. |
|---|---|---|---|
| TiN | 850-960 | 60-90 | 10-90 |
| MT-TiCN | 900-940 | 70-100 | 50-400 |
| HT-TiCN | 900-1050 | 60-150 | 30-200 |
| TiOCN | 950-1050 | 200-500 | 30-70 |
| Al₂O₃ | 950-1050 | 50-120 | 10-500 |
| TiC Nano-reinforcement* | 900-1050 | 50-200 | 3-60 (per reinforcement deposition) |
| TiN (Outer Layer) | 900-1050 | 50-200 | 30-180 |
| TiOCN (Outer Layer)** | 950-1050 | 200-500 | 30-200 |

*Periodic introduction onto alumina layer to form TiC nanophase reinforcement.
**Alternative to TiN outer layer The resulting coating exhibited the properties provided in Table XVI.

TABLE XVI

Properties of CVD Coating

| Coating Layers | Thickness (μm) |
|---|---|
| TiN | 0.4 |
| MT-TiCN | 11.6 |
| HT-TiCN | 0.9 |
| Al₂O₃-[TiN]₉₆ | 9.3 |
| TiN | 1.7 |

Example 3

Coated Cutting Tools

WC—Co cutting insert substrates consistent with the substrates described in Example 1 were placed into an axial flow hot-wall CVD reactor. A coating including a refractory layer comprising a matrix phase of alumina and crystalline TiCN nanoparticle phase was deposited on the cutting inserts according to Tables XVII and XVIII. The crystalline TiCN nanoparticles were distributed in ninety-six (96) nanoparticle concentration bands along the thickness of the refractory layer, the 96 nanoparticle concentration bands corresponding to 96 cycles of TiCN deposition according to Table XVII. An outer layer of TiN was deposited over the nanocomposite refractory layer to complete the coating. Alternatively, if desired, an outer layer of TiOCN can be deposited over the nanocomposite refractory layer to complete the coating.

TABLE XVII

CVD Deposition of Coating

| Process Step | $H_2$ vol. % | $N_2$ vol. % | $TiCl_4$ vol. % | $CH_3CN$ vol. % | $CH_4$ vol. % | $AlCl_3$ vol. % | $CO_2$ vol. % | CO vol. % | HCl vol. % | $H_2S$ vol. % |
|---|---|---|---|---|---|---|---|---|---|---|
| TiN | Bal. | 18.40 | 0.95 | — | — | — | — | — | — | — |
| MT-TiCN | Bal. | 27.8 | 1.31 | 0.001 | — | — | — | — | 1.40 | — |
| HT-TiCN | Bal. | 16.69 | 0.76 | — | 3.70 | — | — | — | — | — |
| TiOCN | Bal. | 17.50 | 1.08 | — | 2.52 | — | — | 1.10 | 1.10 | — |
| $Al_2O_3$ | Bal. | — | — | — | — | 4.84 | 2.42 | — | 3.00 | 0.10 |
| TiCN Nano-reinforcement* | Bal. | 11.62 | 2.45 | — | 1.98 | — | — | — | 2.35 | — |
| TiN (Outer Layer) | Bal. | 25.70 | 0.76 | — | — | — | — | — | 0.69 | — |
| TiOCN** (Outer Layer) | Bal. | 38.00 | 0.99 | — | 2.6 | — | — | 1.12 | 1.00 | — |

**Periodic introduction onto alumina layer to form TiCN nanophase reinforcement
**Alternative to TiN outer layer

TABLE XVIII

CVD Deposition Steps

| Process Step | Temperature ° C. | Pressure mbar | Time min. |
|---|---|---|---|
| TiN | 850-960 | 60-90 | 10-90 |
| MT-TiCN | 900-940 | 70-100 | 50-400 |
| HT-TiCN | 900-1050 | 60-150 | 30-200 |
| TiOCN | 950-1050 | 200-500 | 30-70 |
| $Al_2O_3$ | 950-1050 | 50-120 | 10-500 |
| TiCN Nano-reinforcement* | 900-1050 | 50-200 | 3-60 (per reinforcement deposition) |
| TiN (Outer Layer) | 900-1050 | 50-200 | 30-180 |
| TiOCN (Outer Layer)** | 950-1050 | 200-500 | 30-200 |

*Periodic introduction onto alumina layer to form TiCN nanophase reinforcement.
**Alternative to TiN outer layer The resulting coating exhibited the properties provided in Table XIX.

TABLE XIX

Properties of CVD Coating

| Coating Layers | Thickness (μm) |
|---|---|
| TiN | 0.4 |
| MT-TiCN | 10.1 |
| HT-TiCN | 0.9 |
| $Al_2O_3$-$[TiCN]_{96}$ | 11.6 |
| TiN | 1.8 |

Example 4

Coating Hardness

Coated cutting tools of Examples 1-3 were subjected to nanohardness testing. Nanohardness was determined from nano-indentation testing conducted with a Fischerscope HM2000 in accordance with ISO standard 14577 using a Vickers indenter. Indentation depth was set to 0.2 μm. Nanohardness was determined for coated cutting tools of Examples 1-3 in the as-deposited state and blasted state. Post-coat blasting was administered with an alumina particle slurry for 3-5 seconds with three nozzles. The nozzles provided angles of impingement of 10, 40 and 80 degrees. Blasting removed the outermost TiN layer of the coating. Nanohardness was also determined for comparative cutting inserts of identical ANSI geometry having a CVD coating detailed in Table XX (Comparative 1).

TABLE XX

Comparative Cutting Insert CVD Coating

| Coating Layers | Thickness (μm) |
|---|---|
| TiN | 0.5 |
| MT-TiCN | 10.5 |
| HT-TiCN | 1.0 |
| α-$Al_2O_3$ | 8.4 |
| TiN | 1.5 |

Nanohardness was determined for Comparative 1 cutting inserts in the as-deposited state and blasted state. Blasting conditions for Comparative 1 cutting inserts were the same as that employed for the cutting inserts of Examples 1-3. The results of the nanohardness testing are provided in Table XXI.

TABLE XXI

CVD Coating Nanohardness

| Cutting Insert | Nanohardness (GPa)- As deposited | Nanohardness (GPa)- Wet Blasted |
|---|---|---|
| Example 1 | 29.5 | 33.5 |
| Example 2 | 30.5 | 28.8 |
| Example 3 | 28.5 | 28.7 |
| Comparative 1 | 25.8 | 27.0 |

Example 5

Metal Cutting Testing

Coated cutting inserts of Examples 1-3 and Comparative 1 were subjected to continuous turning testing according to the parameters below. Comparative 1 exhibited the CVD coating architecture in Table XX above. For the turning testing, three separate cutting inserts were tested for each coating architecture of Examples 1-3 and Comparative 1 to generate repetition 1, repetition 2, repetition 3 and mean cutting lifetime.
Turning Parameters
Workpiece: 1045 Steel
Speed: 1000 sfm
Feed Rate: 0.012 ipr
Depth of Cut: 0.08 in
Lead Angle: −5°
Coolant—Flood
End of Life was registered by one or more failure modes of:
Uniform Wear (UW) of 0.012 inches
Max Wear (MW) of 0.012 inches
Nose Wear (NW) of 0.012 inches
Depth of Cut Notch Wear (DOCN) of 0.012 inches
Trailing Edge Wear (TW) of 0.012 inches
The results of the continuous turning testing are provided in Table XXII.

TABLE XXII

Continuous Turning Testing Results

| Coated Cutting Insert | Repetition 1 Lifetime min. | Repetition 2 Lifetime min. | Repetition 3 Lifetime min. | Mean Cutting Lifetime min. | Relative Tool Life vs. Comparative 1 |
|---|---|---|---|---|---|
| Example 1 | 10.2 | 14.5 | 16.4 | 13.7 | 145% |
| Example 2 | 19.9 | 19.9 | 16.9 | 18.9 | 199% |
| Example 3 | 16.3 | 12.3 | 18.6 | 15.7 | 166% |
| Comparative 1 | 9.9 | 8.0 | 10.5 | 9.5 | — |

As provided in Table XXII, each of the coated cutting inserts of Examples 1-3 exhibited dramatic improvements in cutting lifetime relative to Comparative 1.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated article comprising:
   a substrate; and
   a coating deposited by chemical vapor deposition (CVD) adhered to the substrate, the coating including a refractory layer having a matrix phase comprising alumina and a nanoparticle phase dispersed throughout the matrix phase, the nanoparticle phase comprising crystalline nanoparticles formed of at least one of a carbide, nitride and carbonitride of a Group IVB metal.

2. The coated article of claim 1, wherein the crystalline nanoparticles have an average size less than 20 nm in at least one dimension.

3. The coated article of claim 1, wherein the crystalline nanoparticles are substantially spherical or elliptical.

4. The coated article of claim 3, wherein the substantially spherical or elliptical crystalline nanoparticles have an average size of less 5 nm in at least one dimension.

5. The coated article of claim 1, wherein the crystalline nanoparticles are rod-shaped.

6. The coated article of claim 5, wherein the rod-shaped crystalline nanoparticles have an average diameter less than 5 nm and an average length of 10 nm to 500 nm.

7. The coated article of claim 1, wherein the crystalline nanoparticles are dispersed throughout the matrix phase in a predetermined manner.

8. The coated article of claim 1, wherein the crystalline nanoparticles are distributed in the matrix phase in one or more nanoparticle concentration bands.

9. The coated article of claim 8, wherein the nanoparticle concentration bands are separated by a periodic distance.

10. The coated article of claim 9, wherein the periodic distance ranges from 10 nm to 5 µm.

11. The coated article of claim 9, wherein the periodic distance ranges from 10 nm to 500 nm.

12. The coated article of claim 8, wherein distances between the nanoparticle concentration bands vary along thickness of the refractory layer in a predetermined manner.

13. The coated article of claim 1, wherein composition of the crystalline nanoparticles varies with thickness of the refractory layer.

14. The coated article of claim 8, wherein composition of the crystalline nanoparticles varies between the nanoparticle concentration bands.

15. The coated article of claim 8, wherein the nanoparticle concentration bands each have a thickness less than 50 nm.

16. The coated article of claim 8, wherein the crystalline nanoparticles of at least one nanoparticle concentration band are aggregated forming a continuous layer in the matrix phase.

17. The coated article of claim 16, wherein the continuous layer has a thickness of 5 to 50 nm.

18. The coated article of claim 1, wherein alumina grains of the matrix phase are columnar having a size greater than 1 µm.

19. The coated article of claim 1, wherein the alumina grains of the matrix phase are columnar having a size less than 1 µm.

20. The coated article of claim 1, wherein the alumina matrix phase is a substrate for the nanoparticle phase.

21. The coated article of claim 1, wherein the matrix phase further comprises a Group IVB metal dopant.

22. The coated article of claim 1, wherein the refractory layer has thickness of 0.05 µm to 20 µm.

23. The coated article of claim 1, wherein the CVD coating has nanohardness greater than 30 GPa.

24. The coated article of claim 1, wherein the CVD coating has nanohardness of 25 GPa to 35 GPa.

25. The coated article of claim 1 further comprising one or more inner layers between the refractory layer and the substrate, an inner layer comprising one or more metallic elements selected from the group consisting of aluminum and metallic elements of Groups IVB, VB and VIB of the Periodic Table and one or more non-metallic elements of Groups IIIA, VI, VA and VIA of the Periodic Table.

26. The coated article of claim 1, wherein the substrate is cemented carbide, carbide, cermet or steel.

27. A coated article comprising:
a substrate; and
a coating deposited by chemical vapor deposition (CVD) adhered to the substrate, the coating including a refractory layer having a matrix phase comprising alumina and a nanoparticle phase contained within the matrix phase, the nanoparticle phase comprising crystalline nanoparticles formed of at least one of a carbide, nitride and carbonitride of a Group IVB metal, wherein composition of the crystalline nanoparticles varies with thickness of the refractory layer.

28. The coated article of claim 27, wherein the crystalline nanoparticles are distributed in the matrix phase in one or more nanoparticle concentration bands.

29. The coated article of claim 28, wherein the nanoparticle concentration bands are separated by a periodic distance.

30. The coated article of claim 28, wherein the nanoparticle concentrations bands exhibit aperiodic separation.

31. The coated article of claim 27, wherein the crystalline nanoparticles of at least one nanoparticle concentration band are aggregated forming a continuous layer in the matrix phase.

32. The coated article of claim 31, wherein the matrix phase further comprises a Group IVB metal dopant.

33. A coated article comprising:
a substrate; and
a coating deposited by chemical vapor deposition (CVD) adhered to the substrate, the coating including a refractory layer having a matrix phase comprising alumina and a nanoparticle phase contained within the matrix phase, the nanoparticle phase comprising crystalline nanoparticles formed of at least one of a carbide, nitride and carbonitride of a Group IVB metal, wherein the matrix phase further comprises at least one Group IVB metal dopant.

34. The coated article of claim 33, wherein the CVD coating has nanohardness of 25 GPa to 35 GPa.

35. The coated article of claim 33, wherein the refractory layer has thickness of 0.05 µm to 20 µm.

36. The coated article of claim 33, wherein the crystalline nanoparticles are distributed in the matrix phase in one or more nanoparticle concentration bands.

37. The coated article of claim 36, wherein the nanoparticle concentration bands exhibit periodic separation.

* * * * *